(12) United States Patent
Shahar et al.

(10) Patent No.: US 10,883,278 B2
(45) Date of Patent: Jan. 5, 2021

(54) SYSTEM, DEVICE, AND METHOD OF REINFORCEMENT FOR RAISED-FLOORS AND FOR EQUIPMENT THEREON

(71) Applicant: Dynamica Design Ltd., Kfar Vitkin (IL)

(72) Inventors: Rami Shahar, Kfar Vitkin (IL); Jacob Glaubman, Raanana (IL); Anatoly Kovadlo, Moshav Ometz (IL)

(73) Assignee: DYNAMICA DESIGN LTD., Kfar Vitkin (IL)

(*) Notice: Subject to any disclaimer, the term of this patent is extended or adjusted under 35 U.S.C. 154(b) by 0 days.

(21) Appl. No.: 16/466,033

(22) PCT Filed: Jun. 12, 2017

(86) PCT No.: PCT/IL2017/051324
§ 371 (c)(1),
(2) Date: Jun. 3, 2019

(87) PCT Pub. No.: WO2018/104944
PCT Pub. Date: Jun. 14, 2018

(65) Prior Publication Data
US 2020/0071938 A1 Mar. 5, 2020

Related U.S. Application Data

(60) Provisional application No. 62/431,460, filed on Dec. 8, 2016.

(51) Int. Cl.
*E04F 15/024* (2006.01)
*E04B 1/98* (2006.01)

(52) U.S. Cl.
CPC .......... *E04F 15/02458* (2013.01); *E04B 1/98* (2013.01)

(58) Field of Classification Search
CPC .............. E04F 15/024; E04F 15/02458; E04F 15/02464; E04F 15/0247; E04B 1/98
See application file for complete search history.

(56) References Cited

U.S. PATENT DOCUMENTS 4,598,510 A * 7/1986 Wagner, III ...... E04F 15/02183
52/126.6
5,301,480 A * 4/1994 Oyama ............. E04F 15/02482
52/126.6

(Continued)

OTHER PUBLICATIONS

International Search Report (ISR) in PCT/IL2017/051324, dated Mar. 28, 2018.

(Continued)

*Primary Examiner* — Babajide A Demuren
(74) *Attorney, Agent, or Firm* — Eitan Mehulal Sadot

(57) ABSTRACT

System, device, and method of reinforcement for raised-floors and for equipment thereon. A system includes a vertical support member to fixedly connect to a top-tier of a raised-floor and to a bottom-tier of the raised floor. The vertical support member includes an internal rod surrounded by an external pipe. The internal rod and the external pipe are connected via a top-side cap and a bottom-side cap. A modular-length slanted support member is further connected to the vertical support member. The slanted support member is fixedly connected to the bottom-tier of the raised floor, or to another, neighboring, vertical support member.

6 Claims, 13 Drawing Sheets

(56) References Cited

U.S. PATENT DOCUMENTS

| | | | |
|---|---|---|---|
| 5,946,867 A | 9/1999 | Snider | |
| 6,134,858 A | 10/2000 | Gutelius | |
| 8,528,274 B2* | 9/2013 | Zlatar | E04F 15/0247 52/126.6 |
| 9,464,749 B2* | 10/2016 | Heath | E04H 9/02 |
| 2002/0194801 A1* | 12/2002 | Jette | E04F 15/02458 52/220.5 |
| 2005/0246984 A1* | 11/2005 | Colosimo | E04F 15/0247 52/263 |
| 2008/0092460 A1 | 4/2008 | Hilmy | |
| 2012/0073218 A1* | 3/2012 | Zlatar | E04F 15/02458 52/126.6 |
| 2012/0097826 A1* | 4/2012 | Zlatar | H02G 3/385 248/634 |

OTHER PUBLICATIONS

Written Opinion of the International Searching Authority in PCT/IL2017/051324, dated Mar. 28, 2018.

* cited by examiner

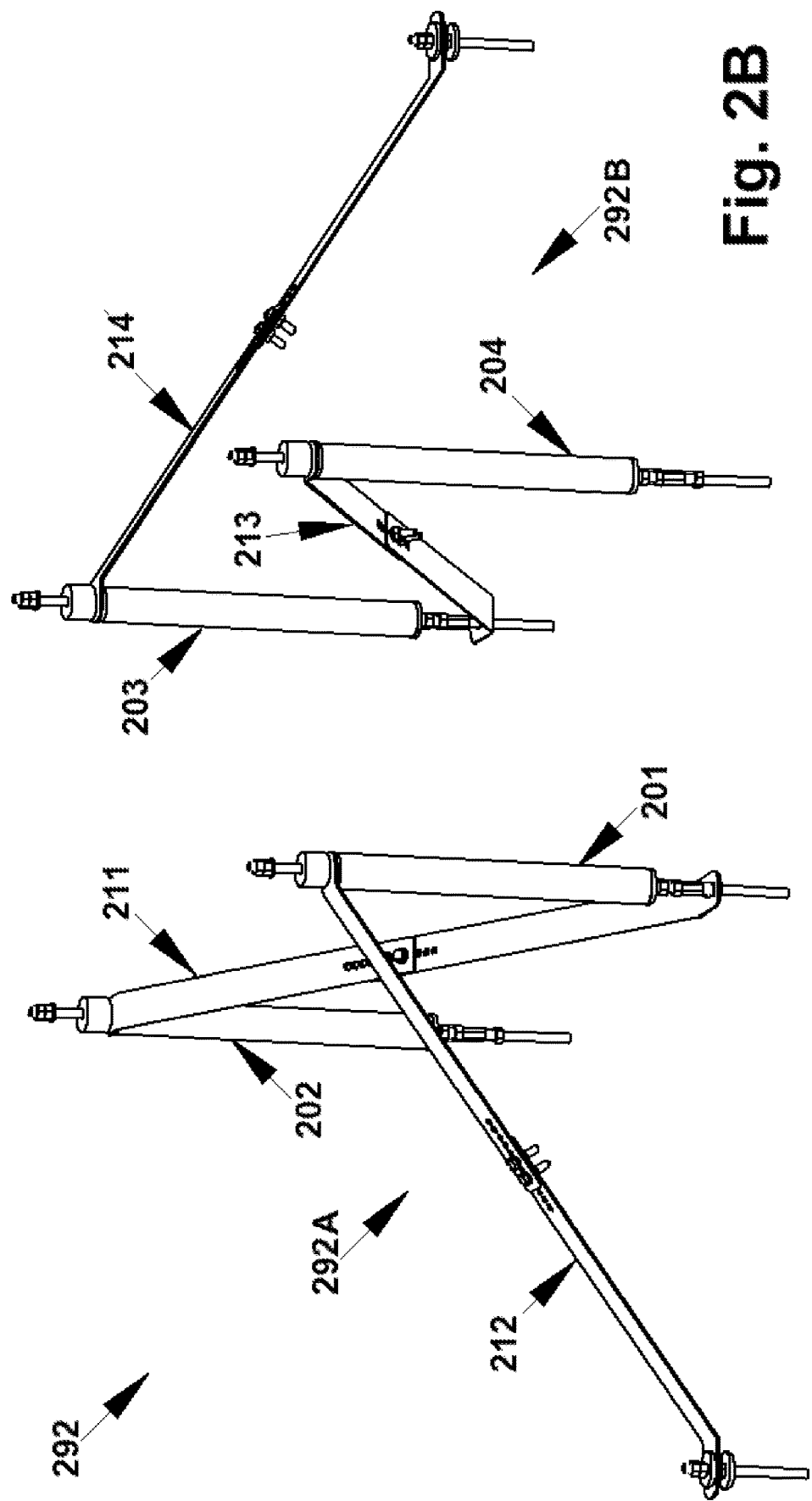

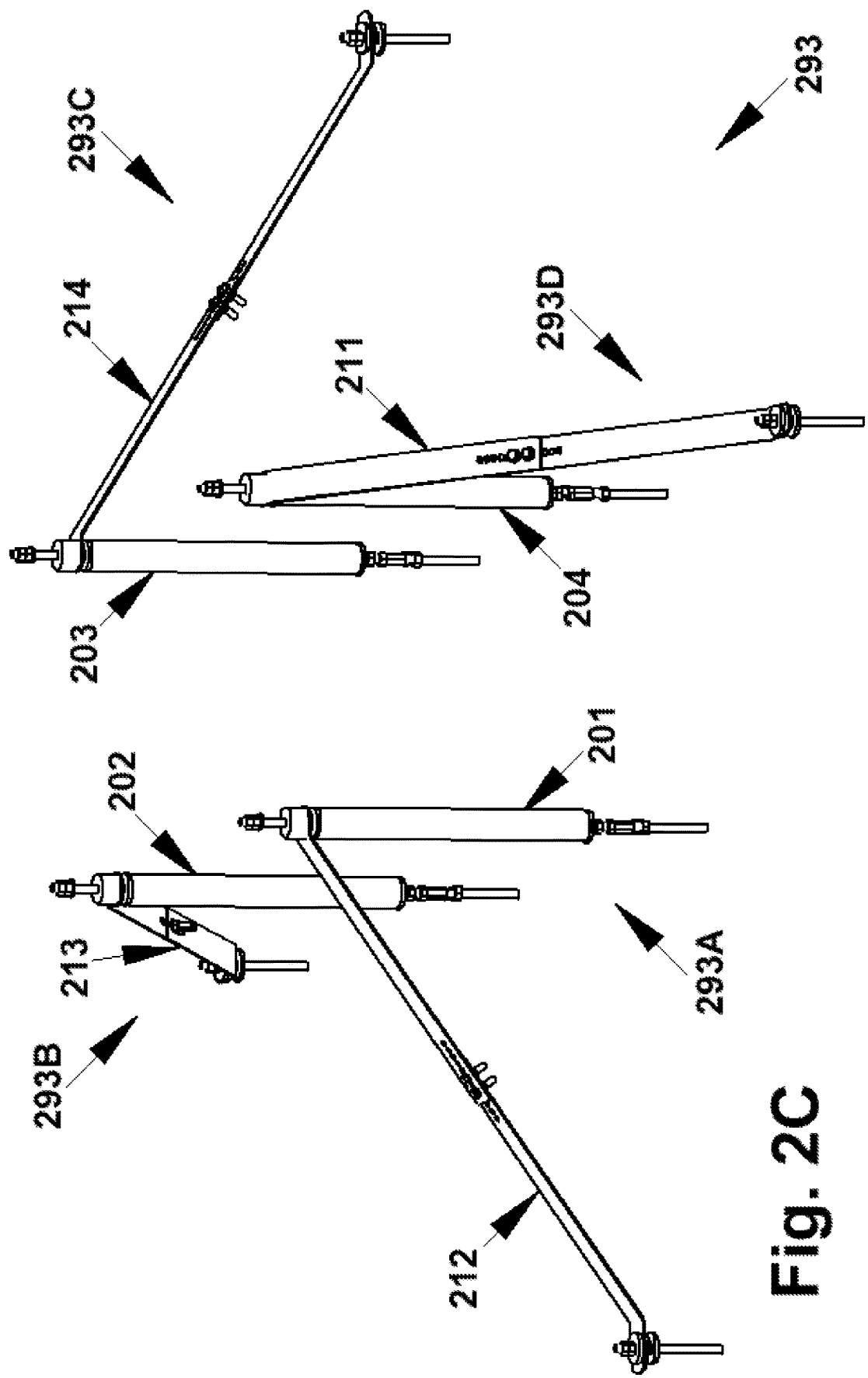

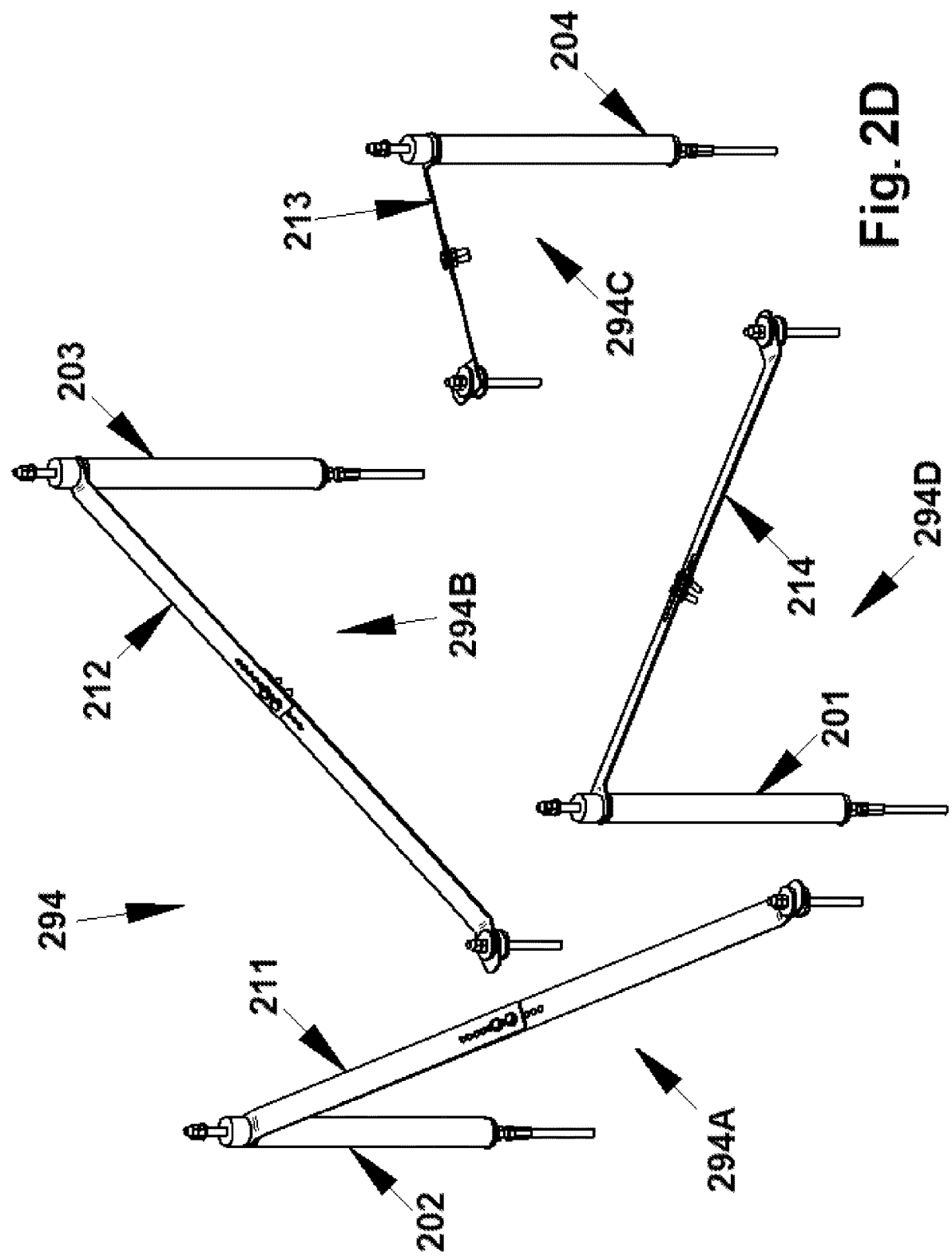

501

502

503

504

505

506

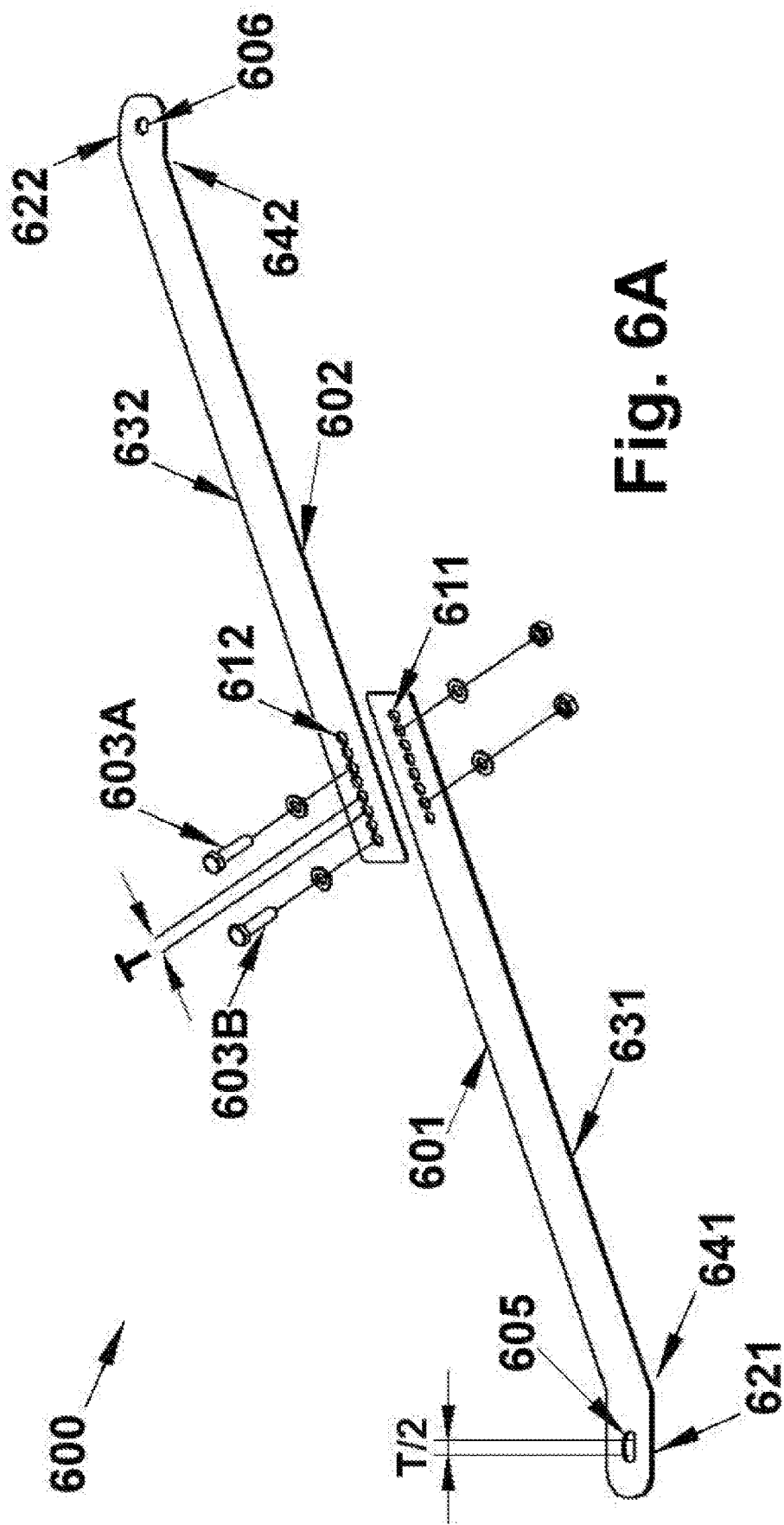

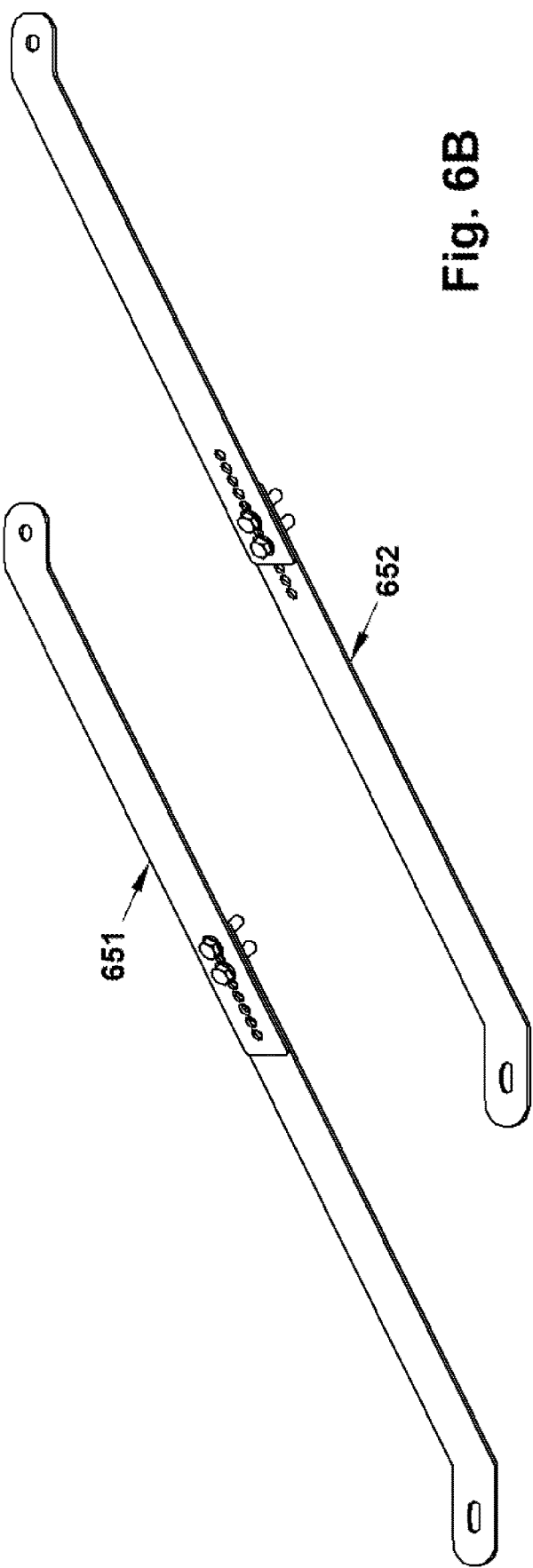

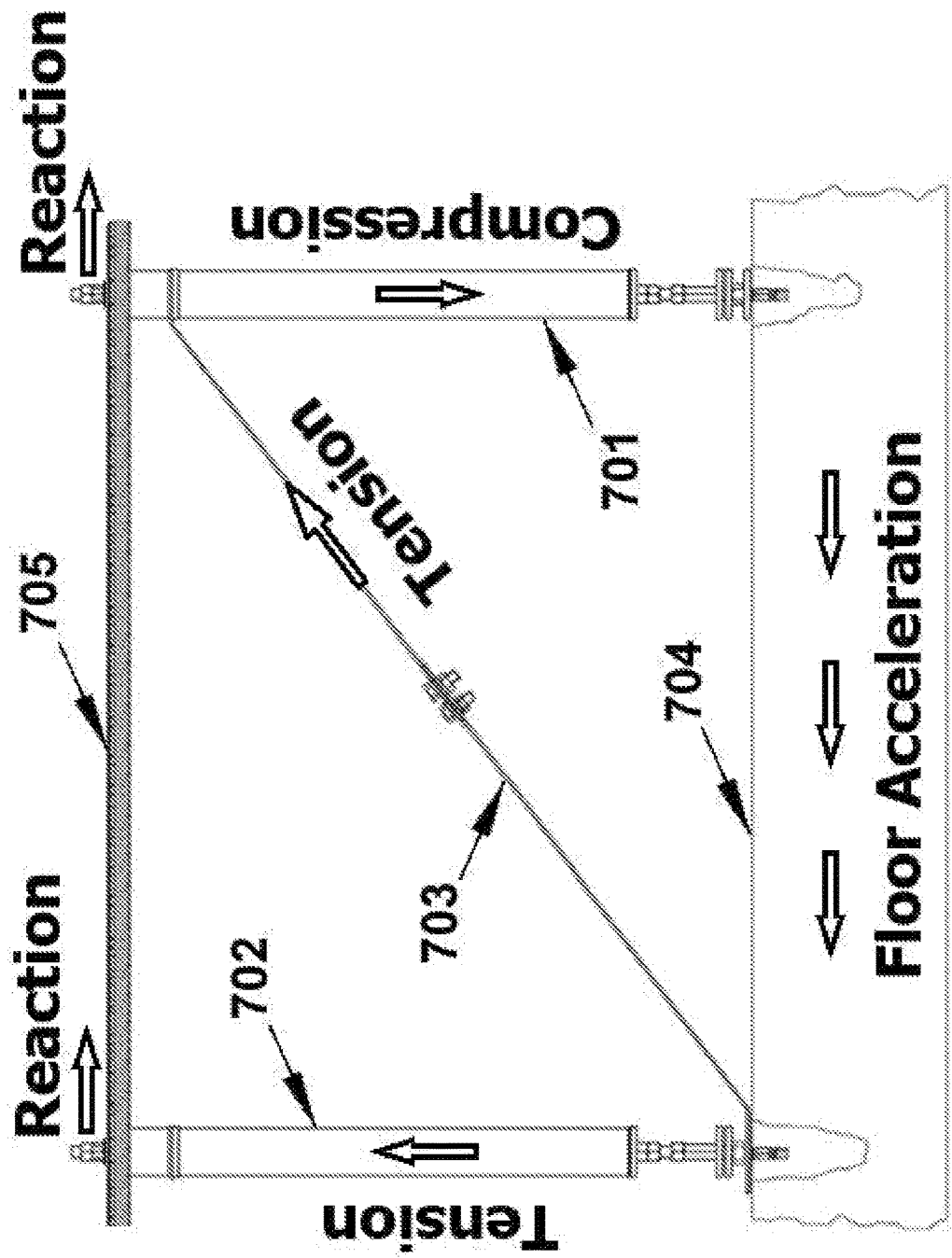

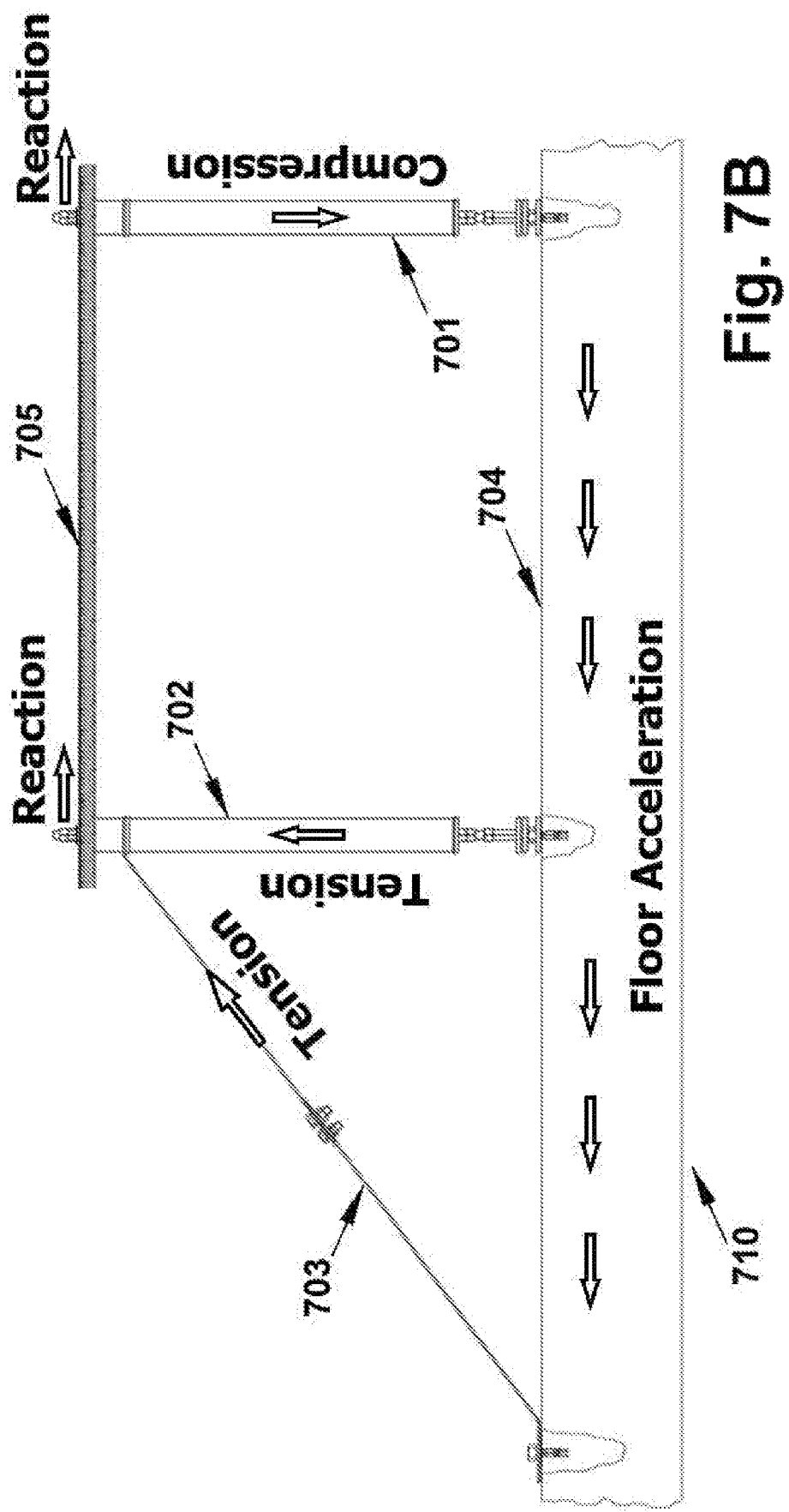

SYSTEM, DEVICE, AND METHOD OF REINFORCEMENT FOR RAISED-FLOORS AND FOR EQUIPMENT THEREON

CROSS-REFERENCE TO RELATED APPLICATIONS

This patent application is a National Stage of PCT international patent application number PCT/IL2017/051324, having an international filing date of Dec. 6, 2017, published as international publication number WO 2018/104944 A1, which is hereby incorporated by reference in its entirety; which claims priority and benefit from United States patent application number U.S. 62/431,460, filed on Dec. 8, 2016, which is hereby incorporated by reference in its entirety.

FIELD

The present invention relates to floors and raised floors.

BACKGROUND

A floor is a bottom surface of a room, hall, chamber, or other structure. A floor may be formed of, for example, cement, wood, bricks, or other suitable materials.

A raised floor is an elevated floor constructed over a base floor, thereby creating a hollow or hidden void between the base floor and the elevated floor. The hollow or hidden void may be used, for example, for routing therein wires or cables, such as electric cables, computer networking cables, or the like.

SUMMARY

Some embodiments of the present invention may comprise systems, devices, and methods of reinforcing a raised floor as well as equipment—particularly heavy and/or sensitive equipment—that is located on such raised floor; and particularly by utilizing an add-on, adjustable or modular reinforcement system within the hollow void or the internal cavity of the raised floor structure.

In some embodiments, a support system comprises: a vertical support member to fixedly connect to a top-tier of a raised-floor and to a bottom-tier of said raised floor; wherein the vertical support member comprises an internal rod surrounded by an external pipe; wherein the internal rod is generally concentric to the external pipe; wherein the internal rod and the external pipe are connected via a top-side cap and a bottom-side cap. In some embodiments, the external pipe is a hollow shell; and the internal rod is non-touching said hollow shell.

In some embodiments, the support system further comprises: a slanted support member that diagonally connects (I) a top-region of the first vertical support member, with (II) the bottom-tier of said raised-floor. The slanted support member has adjustable and non-fixed length, to absorb a tension force due to acceleration of the bottom tier of the raised-floor and due to reaction of the top tier of the raised-floor; and the slanted support member remains securely and firmly affixed to the bottom-tier due via clamping and not necessarily via friction force. In some embodiments, the slanted support member has a modifiable length, and comprises: a first slanted bar having a first set of holes, a second slanted bar having a second set of holes, and at least two bolts and at least two respective nuts, to secure the first slanted bar to the second slanted bar, wherein the two bolts pass through two holes of the first set of holes, and wherein the two bolts also pass through two holes of the second set of holes.

The present invention may provide other and/or additional advantages and/or benefits.

BRIEF DESCRIPTION OF THE DRAWINGS

FIG. 2B is a schematic illustration of an assembly configuration of the support system, in accordance with some demonstrative embodiments of the present invention.

FIG. 2C is a schematic illustration of another assembly configuration of the support system, in accordance with some demonstrative embodiments of the present invention.

FIG. 2D is a schematic illustration of another assembly configuration of the support system, in accordance with some demonstrative embodiments of the present invention.

FIG. 6A is a schematic illustration of an exploded view of a slanted support member, in accordance with some demonstrative embodiments of the present invention.

FIG. 6B is a schematic illustration of a slanted support member in two assembly positions, in accordance with some demonstrative embodiments of the present invention.

FIG. 7A is a schematic illustration of a side-view of a support system, in accordance with some demonstrative embodiments of the present invention.

FIG. 7B is a schematic illustration of a side-view of another support system, in accordance with some demonstrative embodiments of the present invention.

DETAILED DESCRIPTION OF SOME DEMONSTRATIVE EMBODIMENTS OF THE INVENTION

Figure 1:
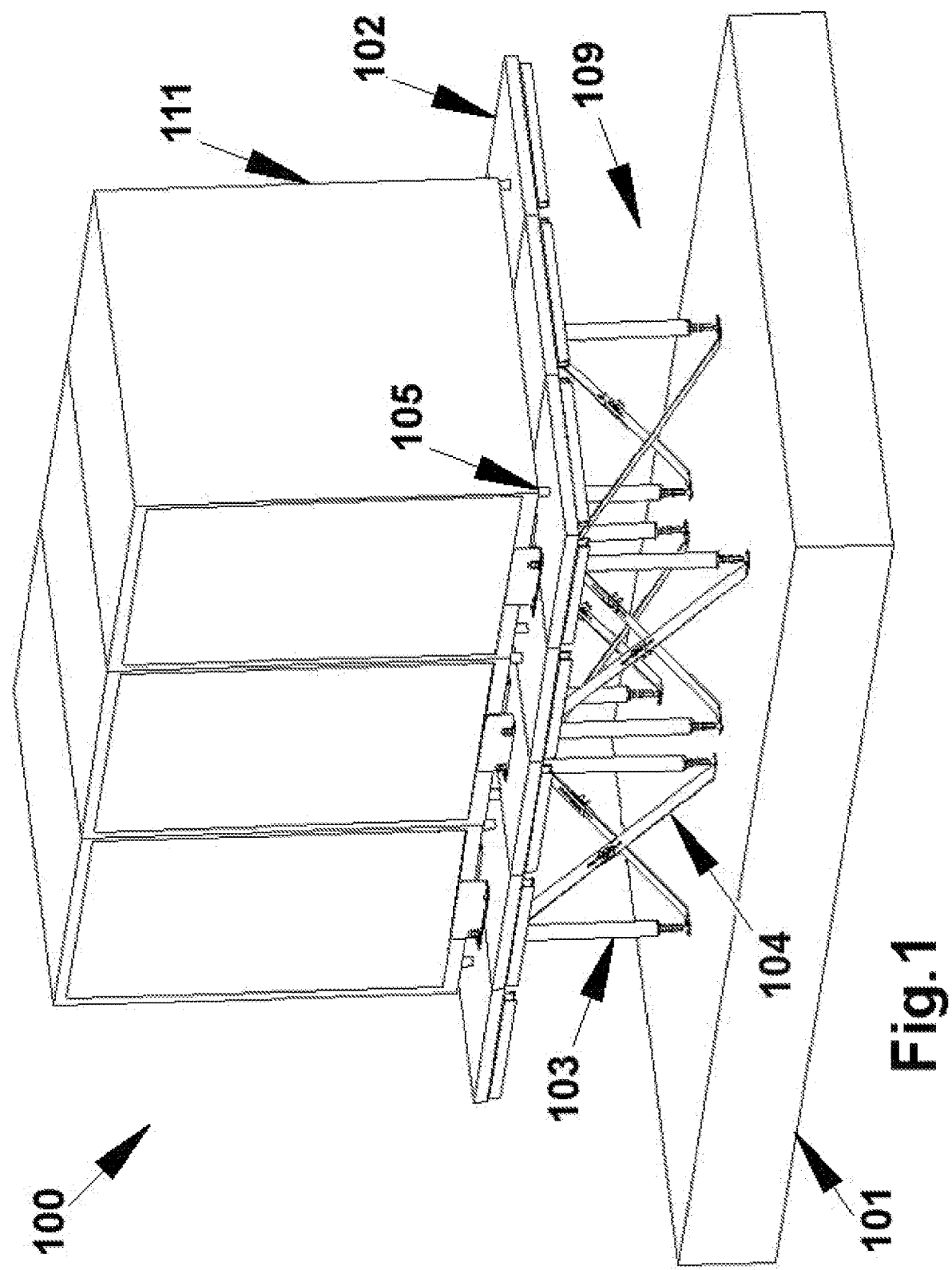
FIG. 1 is a schematic illustration of a system, in accordance with some demonstrative embodiments of the present invention.

The term "raised floor" as used herein may comprise any suitable type of raised flooring, raised access computer floor, elevated floor, two-tier floor, a flooring structure in which a hollow or partially-hollow cavity or void or tunnel separates between a base tier (lower tier) and an elevated tier (top tier), or the like.

In some embodiments, as a non-limiting example, the base tier of the raised floor system may be formed of one or more stiff materials or rigid materials (e.g., cement or concrete); whereas the top tier of the raised floor system may be formed of lightweight modular structure(s) covered by flooring tiles, such that the flooring tiles are held in place by gravity, and/or such that the tiles may be fixed to a flooring frame (e.g., by glue, by screws, by pressure, or by other affixing mechanism).

The Applicants have realized that equipment that is installed or mounted or placed on a raised floor (e.g., data rack, computer servers, machinery, appliances, or the like), may have a relatively high center of gravity, and/or may be very heavy, and/or may be highly sensitive equipment that may be severely damaged if the raised floor collapses or breaks or is accelerated sideways due to external force(s). For example, such equipment may be a rack of computer servers having hard disk drives (HDD) or solid state drives (SDD), which may digitally store significant amounts of highly-sensitive data; and such data may be lost, partially or entirely, if the raised floor malfunctions or breaks or collapses. Even if the raised floor does not necessarily collapse or break, such forces or accelerations may cause the equipment on top of it to tip-over and fall, or to move vertically up and then down, or may cause a local breakage or local collapse of a portion of the raised floor, or may otherwise move or shake in a manner that causes damage to the equipment itself and/or to nearby infrastructure (e.g., wires, cables, pipes, accessories).

The Applicants have realized that a conventional system or raised floor may be subjected to lateral excitations, such as earthquake or volcano eruptions, or even other hazards of a smaller scale (e.g., a shaking of the raised floor after a severe rolling thunder; a shaking of the raised floor due to a passage or due to work performed by heavy machinery or tractors or drilling equipment in a nearby road); and such hazards or excitations may cause equipment forces and/or moments that the raised floor may not be able to adequately support, or that may cause such equipment (e.g., a tall standing Computer Rack) to tip over, or may cause other breakage or malfunction. The Applicants have realized that some types of equipment, when placed over such raised floor, may require additional support with a dynamic level of stiffness or rigidness or rigidity that is greater than the level of support that is provided by a conventional raised floor.

The Applicants have realized that conventional systems fail to provide adequate solutions to these problems. For example, some conventional buildings may be constructed in advance to include a heavy reinforced structure floor, which may require pre-planning, may be costly, and may not be applied to already-built structures or to already-built floors.

The present invention comprises a reinforcement system which may be an add-on to an existing floor, or may be an add-on to an existing raised-floor, or may be constructed by itself when a new building is constructed; enabling efficient, real-time, on-the-worksite adjustment for height, equipment interface and/or anchoring, and without requiring heavy machinery to perform such on-site adjustments.

The system may comprise several (e.g., four) identical or generally similar sub-systems or modules, which may be arranged or structured in accordance with a pattern that supplies or provides resistance at any direction.

The present invention may comprise a system and a method for affixing heavy items (e.g., electronic cabinets, racks) placed on light-weight raised-floors, in a manner that protects the system against seismic forces and/or shocks and/or vibrations; by utilizing a multiplicity of vertical members, each one of them being a vertical stiff element connecting cabinets to the structural floor which withstands compression and tension forces. An adjustable-length diagonal or slanted member is further used, without necessarily utilizing friction as the securing mechanism. The lower section of an adjacent vertical member is utilized for connecting the adjustable diagonal member, thereby inter-connecting a pair of two neighboring vertical members.

Reference is made to FIG. 1, which is a schematic illustration of a system 100, in accordance with some demonstrative embodiments of the present invention. System 100 may comprise a raised floor structure having two spaced-apart and generally-parallel surfaces or tiers, for example: a bottom tier 101 which is a bearing surface (e.g., formed of cement or concrete or other stiff material); and a top tier 102 (e.g., formed of tiles or other generally-horizontal panels). The top tier 102 may be light-weight and/or thinner relative to the bottom tier 101. Optionally, various infrastructure elements such as electric cables, telephone cables, computer networking cables, or the like, may pass through a hollow cavity 109 between the top tier 102 and the bottom tier 102.

Vertical Support Members 103 are multiple generally-vertical support elements, which are perpendicular to bottom tier 101 and are also perpendicular to top tier 102. Two neighboring support members 103 may optionally be inter-connected via a single Slanted Support Member 104, which may extend from a bottom edge or from a lower region of a first Vertical Support Member 103, to a top edge or to an upper region of a neighboring, second, Vertical Support Member 103.

At least some of the Vertical Support Members 103 may comprise an Upper Protrusion 105 which protrudes upwardly through the top tier 102, optionally having a threading mechanism or a screwing mechanism or other connection mechanism that allows to securely connect an Equipment 111 (e.g., a computer rack) onto the Upper Protrusion 105, and enabling stable attachment of the Equipment 111 to the top tier 102 via the Upper Protrusion 105.

System 100 may efficiently absorb vibrations or shaking of the ground or of the entire system, for example, due to an earthquake, a volcanic eruption, a tsunami, a flood, a storm, winds, collapse or breakage of other parts of the building in which the system 100 is located, construction work by heavy machinery in nearby locations, or other natural or human sources of such vibrations or shaking.

Figure 2A:
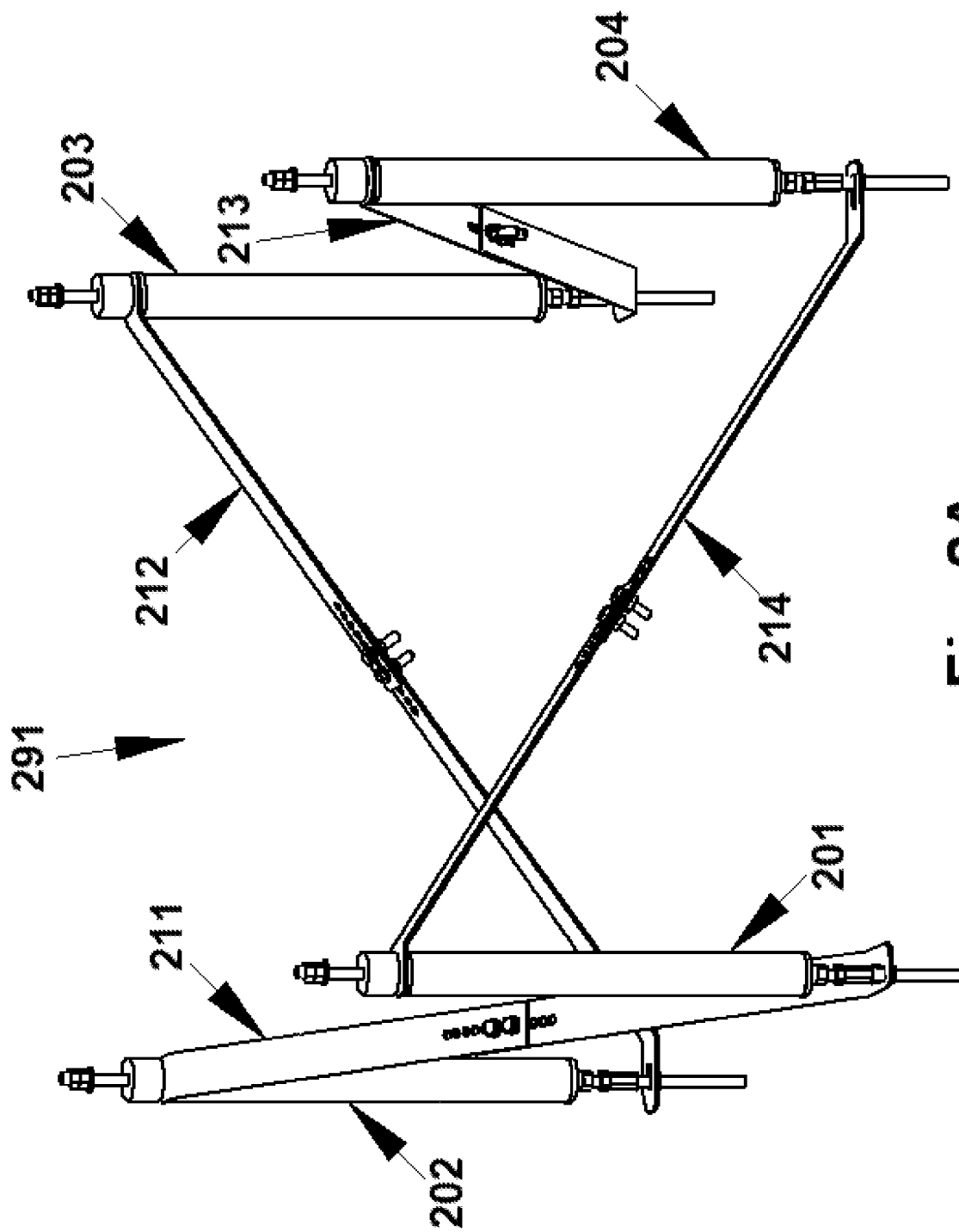
FIG. 2A is a schematic illustration of a support system, in accordance with some demonstrative embodiments of the present invention.

Reference is made to FIG. 2A, which is a schematic illustration of a support system 291, in accordance with some demonstrative embodiments of the present invention. Support system 291 may be placed or connected or attached, for example, within the hollow cavity 109 of system 100; or otherwise between the bottom tier 101 and the top tier 102 of system 100.

Support system 291 may comprise four vertical support members 201-204, which are generally parallel to each other. Each one of the four vertical support members 201-204, is fixedly connected or affixed to the bottom tier of the floor system and to the top tier of the floor system. Optionally, each one of the four vertical support members 201-204, or some of them, may be connected via a slanted support member to one other or to two other of the vertical support members. For example, vertical support member 201 and vertical support member 202 are inter-connected via slanted support member 211; vertical support member 202 and vertical support member 203 are inter-connected via slanted support member 212; vertical support member 203 and vertical support member 204 are inter-connected via slanted support member 213; vertical support member 204 and vertical support member 201 are inter-connected via slanted support member 214.

As further demonstrated in FIGS. 2A, 2B, 2C and/or 2D, in some embodiments, the four slanted support members 211-214 may have the same slanted length; such that a top-view of the four vertical support members 201-204 comprises four corners of a perfect square; and/or such that the four slanted support members 211-214, when viewed from a top-view, are generally perpendicular to each other. In other embodiments, a first pair of the slanted support member (211, 213) have a first slanted length; whereas a second pair of the slanted support members (212, 214) has a second, different, slanted length; such that, for example, a top-view of the four vertical support members 201-204 comprises four corners of a rectangle that is not a perfect square. In other embodiments, other slanted lengths may be used; such that, for example, the top-view of the four vertical support members 201-204 comprises four corners of a parallelogram or a trapezoid or a rhombus or other suitable shape.

For demonstrative purposes, support system 291 shows four vertical support members 201-204 and four slanted support members 211-214. However, the present invention may comprise other suitable structures, for example, such that only two (and not more) vertical support members are inter-connected; or such that three (and not more) vertical support members are inter-connected; or such that 5 or 6 or 8 or other number of vertical support members are inter-connected; or such that other type of structure or polygon is formed as a top-view of the support system 291.

Optionally, the length of each vertical support member may be adjustable or modifiable or configurable, via a length-adjusting mechanism. For example, a vertical support member may be formed of a stainless steel rod or a metal rod having a threading or a screwing mechanism, able to accommodate a complementing addendum member (e.g., typically having a shorter length) which may be threaded or screwed around the stainless steel or metal rod until a desired depth is reached, thereby enabling an installer to adjust the precise length of each vertical support member, and/or further enabling installation if the bottom tier and the top tier are not perfectly parallel to each other or are not perfectly flat, and/or enabling to prepare in advance the vertical support member to be approximately at the raw or rough or estimated height that is suitable for a particular installation.

Optionally, the length of each slanted support member may be adjustable or modifiable or configurable, via a length-adjusting mechanism. For example, a slanted support member may be formed of two stainless steel bars, or two metal bars, having multiple openings for a nut or a screw, and the two bars of the slanted support members are inter-connected to each other via a nut-and-bolt mechanism or other suitable connection mechanism; thereby enabling an installer to adjust the precise length of each slanted support member, and further enabling installation if the bottom tier and the top tier are not perfectly parallel to each other or are not perfectly flat (and thus slightly different slanted-length is needed for one or more of the slanted support members).

Reference is made to FIG. 2B, which is a schematic illustration of an assembly configuration 292 of the support system, in accordance with some demonstrative embodiments of the present invention. Configuration 292 may comprise two sub-structures 292A and 292B; and may be placed or connected or attached or affixed, for example, within the hollow cavity 109 of system 100; or otherwise between the bottom tier 101 and the top tier 102 of system 100.

Support sub-structure 292A may comprise two vertical support members 201-202, and two slanted support members 211-212. Similarly, support sub-structure 292B may comprise two vertical support members 203-204, and two slanted support members 213-214. The vertical length of each vertical support member (201, 202, 203, 204) may be adjusted or modified via a screwing/threading mechanism, which may be located at or near the top edge of the vertical support member, or may be located at or near the bottom edge of the vertical support member, or may be located at or near another region of the vertical support member (e.g., at or near a vertically-central region of the vertical support member). The slanted length of each slanted support member may be adjusted or modified via a nut-and-bolt mechanism in a manner that enables modular modification of the slanged length of each slanted support member. The lower end of slanted support member may be attached directly to the bottom tier, via a suitable attachment mechanism.

Reference is made to FIG. 2C, which is a schematic illustration of another assembly configuration 293 of the support structure, in accordance with some demonstrative embodiments of the present invention. Assembly configuration 293 may comprise, for example, four support sub-structures 293A, 293B, 293C and 293D. Each one of the four support sub-structures 293A, 293B, 293C and 293D comprises one vertical support member that is connected to one slanted support member. The top edge of the vertical support member may be fixedly attached to a top tier of a raised floor system. The bottom edge of the vertical support member may be fixedly attached to a bottom tier of the raised floor system. The bottom edge of the slanted support member may also be fixedly attached to the bottom tier of the raised floor system. In some embodiments, as depicted, support sub-structure 293A is not directly connected to any other of the support sub-structures 293B, 293C and 293D, and there is no slanted support member that inter-connects a pair of two, separate, support sub-structures 293A, 293B, 293C and 293D. In other embodiments, an additional slanted support member may be added in order to inter-connect two neighboring support sub-structures out of the multiple support sub-structures 293A, 293B, 293C and 293D.

Reference is made to FIG. 2D, which is a schematic illustration of another assembly configuration 294 of the support structure, in accordance with some demonstrative embodiments of the present invention. Assembly configuration 294 may comprise, for example, four support sub-structures 294A, 294B, 294C and 294D. Each one of the four support sub-structures 294A, 294B, 294C and 294D comprises one vertical support member that is connected to one slanted support member. The top edge of the vertical support member may be fixedly attached to a top tier of a raised floor system. The bottom edge of the vertical support member may be fixedly attached to a bottom tier of the raised floor system. The bottom edge of the slanted support member may also be fixedly attached to the bottom tier of the raised floor system. In some embodiments, as depicted, support sub-structure 294A is not directly connected to any other of the support sub-structures 294B, 294C and 2943D, and there is no slanted support member that inter-connects a pair of two, separate, support sub-structures 294A, 294B, 294C and 294D. In other embodiments, an additional slanted support member may be added in order to inter-connect two neighboring support sub-structures out of the multiple support sub-structures 294A, 294B, 294C and 294D.

Figure 3:
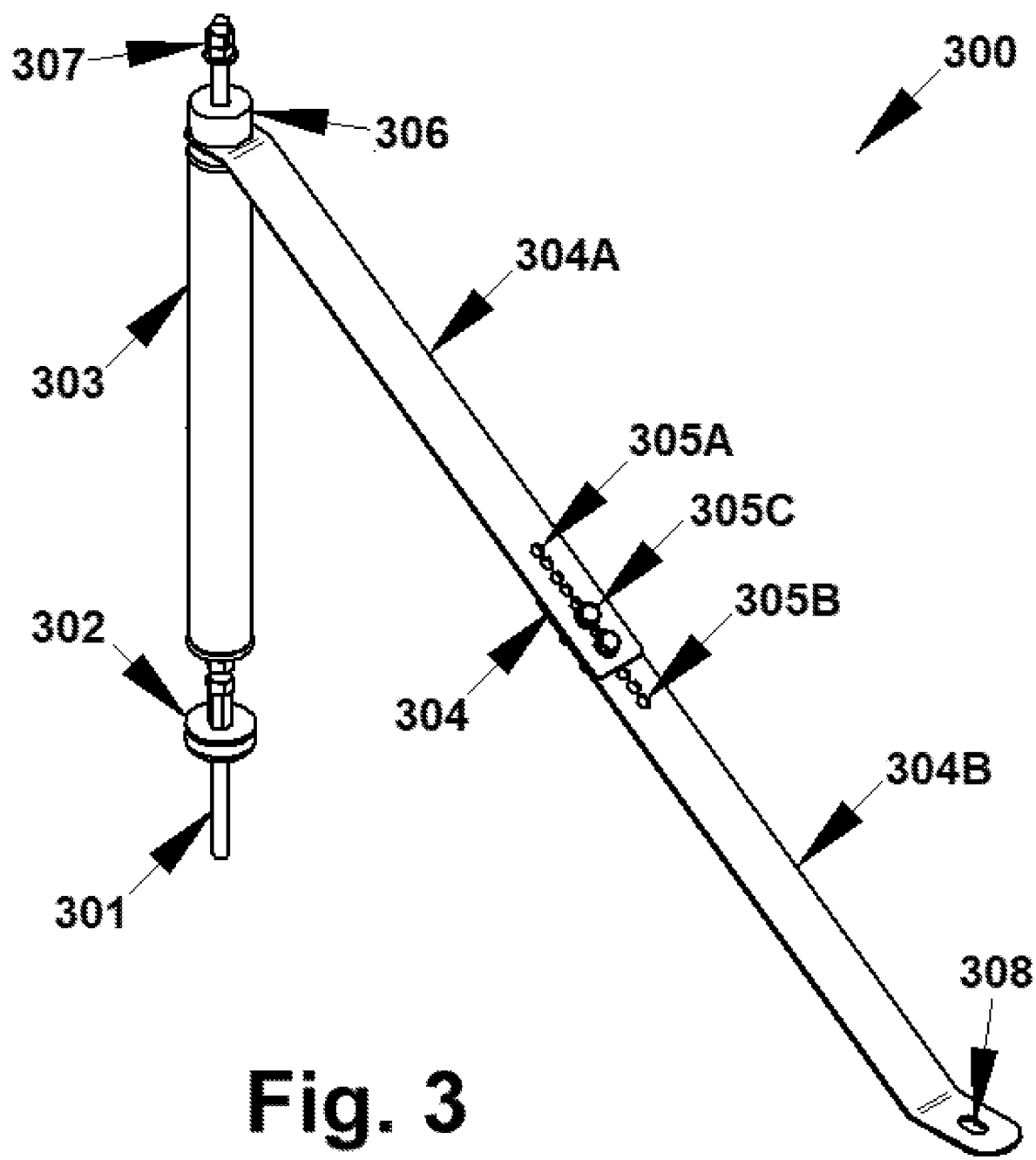
FIG. 3 is a schematic illustration of one of the multiple sub-systems that the support system is comprised of, in accordance with some demonstrative embodiments of the present invention.

Reference is made to FIG. 3, which is a schematic illustration of a support structure 300, in accordance with some demonstrative embodiments of the present invention. Support structure 300 may be placed or connected or attached, for example, within the hollow cavity 109 of system 100; or otherwise between the bottom tier 101 and the top tier 102 of system 100.

Support structure 300 comprises a vertical support member 303 (or rod, or pole, or stud) and a slanted support member 304. For example, the top region of vertical support member 303 is connected to the top region of vertical support member 304, via a connection mechanism 306 (e.g., a nut).

Optionally, slanted support member 304 is formed of two slanted bars 304A and 304B, which are generally-parallel to each other; each one of them having a series of adjacent openings or holes (305A, 305B) such that a nuts-and-bolts connection mechanism 305C connects the two slanted bars 304A and 304B at a desired overall slanted length. Optionally, the vertical length of the vertical support member 302 may be adjusted or modified via a push-pull mechanism, or via a threading or screwing multiple-parts mechanism, or via other suitable mechanism.

The lower edge of slanted support member 304 comprises a long hole or opening 308, or other suitable elongated hole or non-circular opening, to allow fixed attachment of that lower edge of slanted support member 304 to a lower tier of a raised floor system. The lower edge of vertical support member 303 comprises a mechanism to allow fixed attachment of that lower edge of vertical support member 303 to the bottom tier of the raised floor system, for example, via a seismic anchor bolt 301 and a mechanism 302 of a coupler with two (or more) discs.

The upper region of vertical support member 303 comprises an attachment mechanism 307 to allow fixed attachment of that upper region of vertical support member 303 to the top tier of the raised floor system and/or to the Equipment itself that is on top of the top tier. In some embodiments, optionally, the coupler may be used to clamp the lower part of another (e.g., a neighboring) slanted support member to the anchor between the discs. In some embodiments, optionally, the coupler enables fine tuning of the final height of the vertical support member.

In some embodiments, the pole structure of the vertical support member enables it to support tension and compression loads without buckling, and therefore serve as seismic support; for example, by implementing the vertical support member as a pole being a threaded rod within a thin wall pipe, tightened to each other via two caps.

Figure 4:
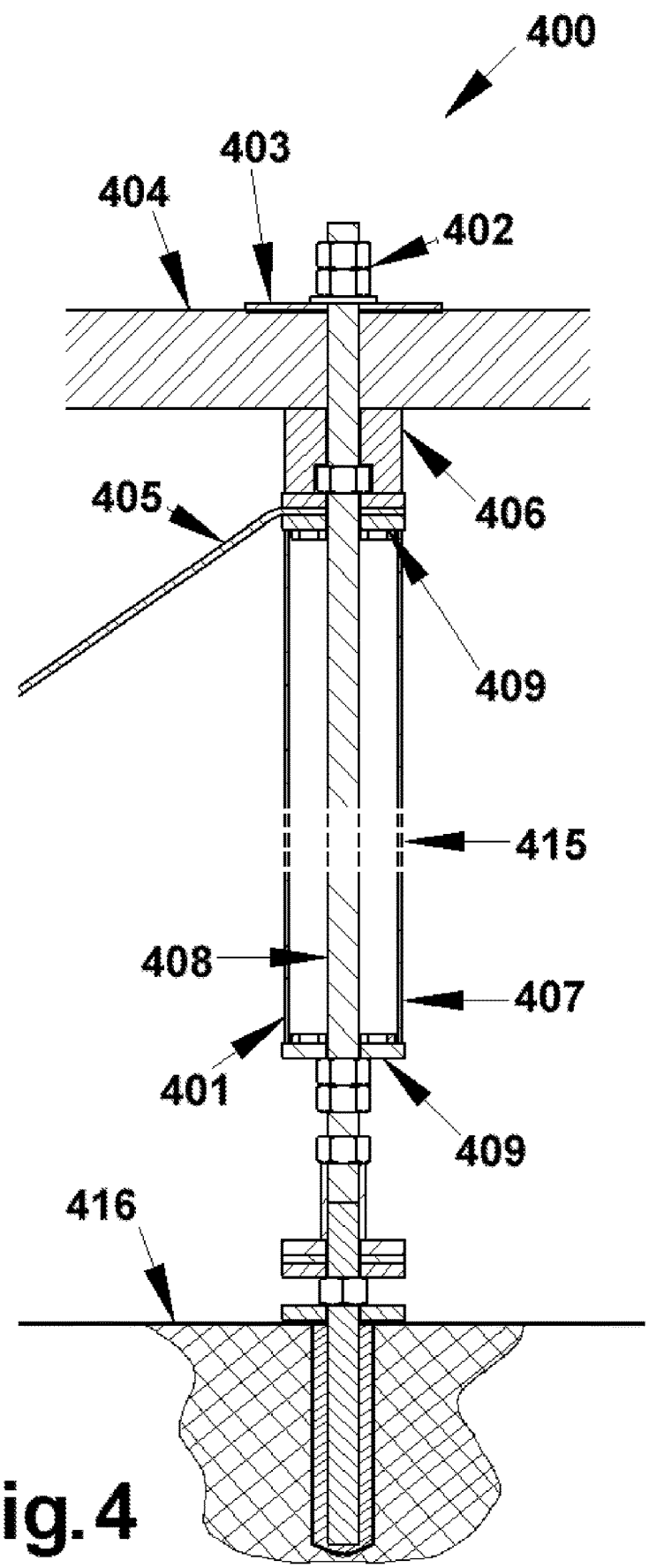
FIG. 4 is a schematic illustration of a vertical support member, in accordance with some demonstrative embodiments of the present invention.
Figure 5A:
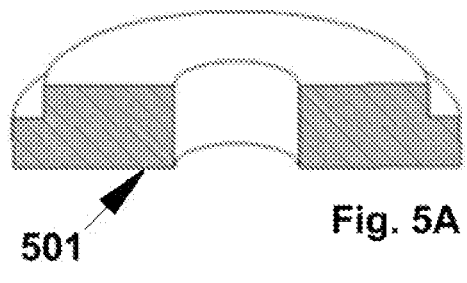
FIGS. 5A to 5F are schematic illustrations of caps, in accordance with some demonstrative embodiments of the present invention.
Figure 5B:
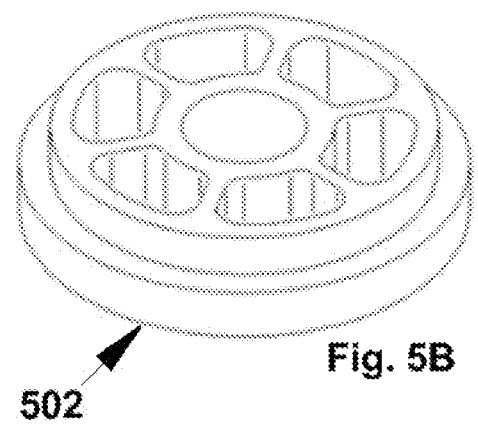
Figure 5C:
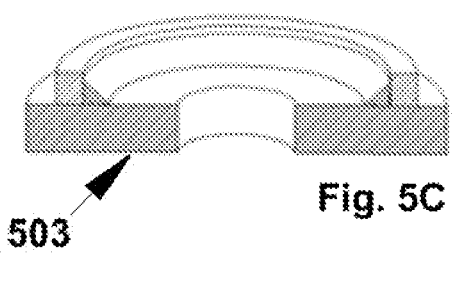
Figure 5D:
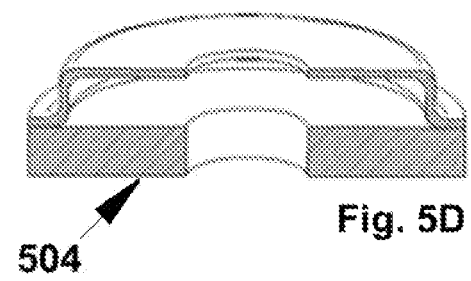
Figure 5E:
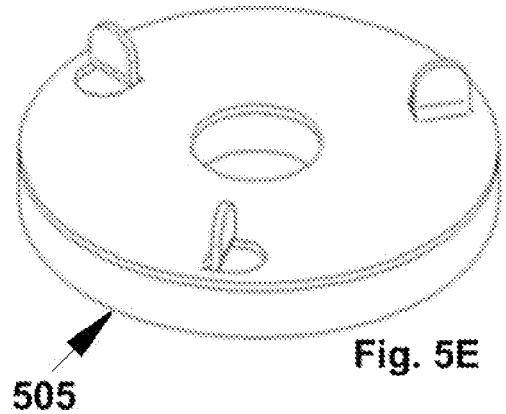
Figure 5F:
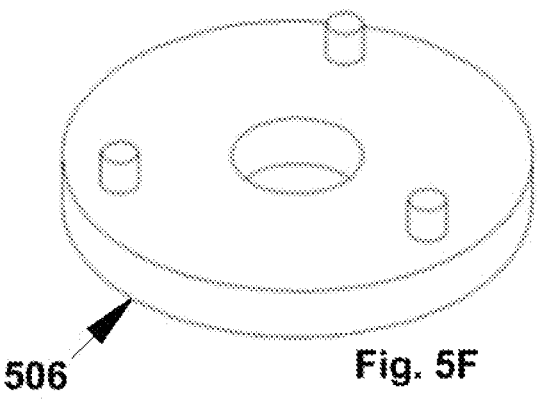

Reference is made to FIG. 4, which is a schematic illustration of a vertical support member 400, in accordance with some demonstrative embodiments of the present invention. Vertical support member 400 may be a demonstrative implementation of vertical support member 300 described above, and/or of other vertical support structures described above. Vertical support member 400 is fixedly attached to a low-tier of a raised floor system, for example, to a cement layer or concrete layer 416.

Vertical support member 400 comprises an internal rod 408 which is surrounded by, or encircled by, or encapsulated within, an external pipe 401. The pipe may be round, rectangular or any other shape. The internal rod 408 is formed of a stiff material, for example, steel or iron or stainless steel. The external pipe 401 may be formed of other suitable metal or other material.

In some embodiments, the cross-section of the internal rod 408 is circular; or is square-shaped; or is rectangular; or is pentagon shaped; or is hexagon shaped; or has other suitable cross-section shape (e.g., oval, egg-shaped, elliptic, octagon, polygon, star-shaped). Additionally or alternatively, the cross-section of the external pipe 401 is circular; or is square-shaped; or is rectangular; or is pentagon shaped; or is hexagon shaped; or has other suitable cross-section shape (e.g., oval, egg-shaped, elliptic, octagon, polygon, star-shaped). In some embodiments, the cross-section of the internal rod 408, has the same shape as the shape of the cross-section of the external pipe 401. In other embodiments, the cross-section of the internal rod 408, has a shape that is different from the shape of the cross-section of the external pipe 401. In some embodiments, the cross-section of the internal rod 408 and/or the cross-section of the external pipe 401 may be selected or may be determined in advance, for example, in order to achieve a desired level of rigidity or rigidity or support, and/or in order to accommodate a particular form-factor or size constraints or weight constraints or other implementation goals.

In some demonstrative and non-limiting embodiments, the diameter of the internal rod 408 is in the range of 8 to 40 millimeters; whereas, the diameter of the external pipe 401 is in the range of 40 to 100 millimeters. In other embodiments, the diameter of the internal rod 408 is in the range of 10 to 32 millimeters; whereas, the diameter of the external pipe 401 is in the range of 40 to 100 millimeters. In other embodiments, the diameter of the internal rod 408 is in the range of 15 to 25 millimeters; whereas, the diameter of the external pipe 401 is in the range of 50 to 80 millimeters. Other suitable ranges or values may be used, and other suitable metals or materials may be used.

An arrow 415 indicates that the internal rod 408 and the external pipe 401 continue vertically (as indicated by the dashed lines shown there vertically).

The length of the external pipe 401 may be adjusted by the installer in the field, for example, by cutting or sawing (e.g., at point 407), for height adjustment; and in order to enable a diagonal or slanted support member to be connected at a spacer distance from the floor tile, thereby releasing or absorbing all moments from the internal rod 408. One or more top-side nuts 402 may be used for final tightening of the equipment interface bracket 403, the floor tile 404, the diagonal or slanted support member 405, via a spacer 406, the external pipe 401, the internal rod 408 and the caps 409.

In some embodiments, the external pipe 401 is a hollow shell or a hollow cylinder (or, has other shape or structure which is generally hollow and which may have other suitable shape of cross-section, such as triangular, square, rectangular, hexagon, pentagon, circular, oval, star, or the like); and the external pipe 401 is concentric relative to the internal rod 408; such that except for being connected to the inner rod 408 via the caps 409, the external pipe 401 does not otherwise touch the internal rod 408, and a hollow cavity surrounds the internal rod 408 and separates between the internal rod 408 and the external pipe 401.

The diameter of the inner rod 408 is D1, and the diameter of the external pipe 401 is D2. In some embodiments, the diameters ratio D1/D2 is 1/10, or is 1/8, or is 1/6, or is 1/4, or is 1/3, or is 1/2, or is 1/1.5 (or is 2/3). In some embodiments, the diameters ratio D1/D2 is less than 1/10, or is less than 1/8, or is less than 1/6, or is at least 1/2, or is at least 1/3; or is in the range of 1/2 to 1/8, or is in the range of 1/3 to 1/6. Other suitable values or ratios may be used.

Reference is made to FIGS. 5A to 5F, which are schematic illustrations of caps 501-506, in accordance with some demonstrative embodiments of the present invention. Each one of caps 501-506 may be a demonstrative implementation of a cap holding together the external pipe and the internal rod of a vertical support member. As demonstrated, cap 501 is a machined cap; cap 502 is a casted cap; cap 503 is welded cap; cap 504 is a dimpled cap; cap 505 is a bended cap; cap 506 is a pined cap or a bolded cap. Other suitable types of caps may be used.

Reference is made to FIG. 6A, which is a schematic illustration of an exploded view of a slanted (or diagonal) support member 600, in accordance with some demonstrative embodiments of the present invention. Slanted support member 600 comprises a bottom bar 601 and a top bar 602, which may be inter-connected to each other by using one or more bolts, or by using two or more bolts (for example, two bolts 603A and 603B) that are inserted at particular holes within a set or batch of available holes in each one of the two bars 601-602.

For example, bar 601 has a set of holes 611, whereas bar 602 has a set of holes 612; and the two bolts 603A-603B are inserted through two particular holes of the set of holes 611 and also through two particular holes of the set of holes 612, and are tightened by using washers and nuts. In some embodiments, the distance between the centers of two adjacent holes 612 of the top bar 602 is denoted T; and is the same as the distance between the centers of two adjacent holes 611 of the bottom bar 601.

The bottom bar 601 ends with a non-slanted region or with a generally-horizontal region 621; for example, forming an obtuse angle 641 between (I) the non-slanted region 621 of bottom bar 601, and (II) the slanted region 631 of bottom bar 601. For example, in some embodiments, the obtuse angle 641 may be 135 degrees, or may be in the range of 130 to 140 degrees, or may be in the range of 120 to 150 degrees, or may be in the range of 110 to 160 degrees, or may be smaller than 160 degrees, or may be greater than 110 degrees.

The length of the bottom bar 601 is denoted L; it is equivalent to the sum of: the length L1 of the slanted region 631, plus the length L2 of the non-slanted region 621, such that L=L1+L2. In some embodiments, L2 is at most 30 percent of L, and L1 is at least 70 percent of L. In some embodiments, L2 is at most 25 percent of L, and L1 is at least 75 percent of L. In some embodiments, L2 is at most 20 percent of L, and L1 is at least 80 percent of L. In other embodiments, L2 is at most 15 percent of L, and L1 is at least 85 percent of L. In other embodiments, L2 is at most 10 percent of L, and L1 is at least 90 percent of L. In other embodiments, L2 is at most 5 percent of L, and L1 is at least 95 percent of L. Other suitable sizes or size-ratios may be used.

The top bar 602 ends with a non-slanted region or with a generally-horizontal region 622; for example, forming an obtuse angle 642 between (I) the non-slanted region 622 of top bar 602, and (II) the slanted region 632 of bottom bar 602. For example, in some embodiments, the obtuse angle 642 may be 135 degrees, or may be in the range of 130 to 140 degrees, or may be in the range of 120 to 150 degrees, or may be in the range of 110 to 160 degrees, or may be smaller than 160 degrees, or may be greater than 110 degrees. Other suitable values or ranges may be used.

The length of the top bar 602 is denoted K; it is equivalent to the sum of: the length K1 of the slanted region 632, plus the length K2 of the non-slanted region 622, such that K=K1+K2. In some embodiments, K2 is at most 20 percent of K, and K1 is at least 80 percent of K. In other embodiments, K2 is at most 15 percent of K, and K1 is at least 85 percent of K. In other embodiments, K2 is at most 10 percent of K, and K1 is at least 90 percent of K. In other embodiments, K2 is at most 5 percent of K, and K1 is at least 95 percent of K. Other suitable sizes or size-ratios may be used.

In some embodiments, the utilization of two inter-connected bars, each one of them being a monolithic bar having an elongated slanted region that is longer (length L1) and a shorter non-slanted region that is shorter (length L2), such that the shorter non-slanted region is ready to be affixed at a generally-horizontal orientation (e.g., generally parallel to the ground or to the bottom-tier), and particular is ready to be affixed to the bottom-tier via a clamping mechanism or a suitable screwing mechanism, enables the slanted support member to be firmly and securely affixed (e.g., to the bottom-tier or to the ground) due to such clamping, and not due to a friction force, or not necessarily by (or not exclusively by) a friction force; thereby providing increased level of support that the slanted support member provides to the support system. Similar considerations and discussion may also apply to the other bar of the slanted support member, with K1 and K2 replacing (respectively) L1 and L2.

The cross-section of each bar (601, 602) is wide and thin, and supplies the necessary area for tension stiffness, while also enabling some fine-tuned bending for angle changes (e.g., to accommodate different height and length of connected elements or members). The holes pattern in each bar enables modular length changes at constant decrements, with positive connection such that the bolts hold by shear and not by friction. The generally-vertical region 621 has a slotted hole 605; and the generally-vertical region 622 has a slotted hole 606. The slotted holes 605-606 enable even further fine-tuning within said constant decrement. When the slanted support member is tightened to the system, it is clamped between the discs and is firmly affixed. In some embodiments, the diameter of the slotted hole (605, 606) or the longest dimension of the slotted hole (605, 606) is different from T; and may be, for example, equal to T/2 or other suitable value, to enable the further fine-tuning of the length of the slanted support member 600.

Reference is made to FIG. 6B, which is a schematic illustration of a slanted support member in two assembly positions, in accordance with some demonstrative embodiments of the present invention: position 651 is a fully-collapsed or fully-shrunk position or is the shortest-possible position of the slanted support member; whereas position 652 demonstrates an extended position out of several possible extended positions having different length values, depending on which holes are selected for engaging with the bolts out of the available sets of holes in each bar of the slanted support member. The significant length changing ability ensures that the slanted support member is always attached (via the spacer) to the floor tiles and the equipment interface; and provides the modular flexibility to utilize the slanted support member with various types of raised-floor systems.

For demonstrative purposes, FIG. 6A, FIG. 6B, and/or other drawings, may show the slanted support members as two bars that are inter-connected via a nuts-and-bolts mechanism. However, this is only a non-limiting example, and other suitable connection mechanism(s) may be used in conjunction with the slanted support member of the present invention; for example: a single threaded bolt with one or two threaded nuts; a first bar having a threading, a second bar having holes, and a connection mechanism utilizing bolt(s) without nut(s); a first bar having first-size holes, a second bar having smaller second-size holes, and a connection mechanism using screws; a first bar having holes, a second bar having markings or indicators, and a connection mechanism utilizes drilling of screws through the holes towards the markings or indicators; one or more pins or protrusions or male-female mechanisms, optionally utilizing one or more connection mechanisms (e.g., screwing, threading, internal threading, external threading, shoulder connector, slit and closing ring, radial hole with securing pin, pressured insertion of a male part into a corresponding female part, or the like).

Reference is made to FIG. 7A, which is a schematic illustration of a side-view of a support system 700, in accordance with some demonstrative embodiments of the present invention. System 700 may correspond to, or may be an implementation of, for example, system 291 of FIG. 2A.

System 700 comprises a first vertical support member 701 and a second vertical support member 702, each one of them affixed to a low-tier 704 and to a top-tier 705 of a raised-floor system; and system 700 further comprises a slanted support member 703.

Reference is also made to FIG. 7B, which is a schematic illustration of a side-view of a support system 710, in accordance with some demonstrative embodiments of the present invention. System 710 may correspond to, or may be an implementation of, for example, system 292 of FIG. 2B and/or system 293 of FIG. 2C.

System 710 comprises a first vertical support member 701 and a second vertical support member 702, each one of them affixed to a low-tier 704 and to a top-tier 705 of a raised-floor system; and system 710 further comprises a slanted support member 703.

Figure 7C:
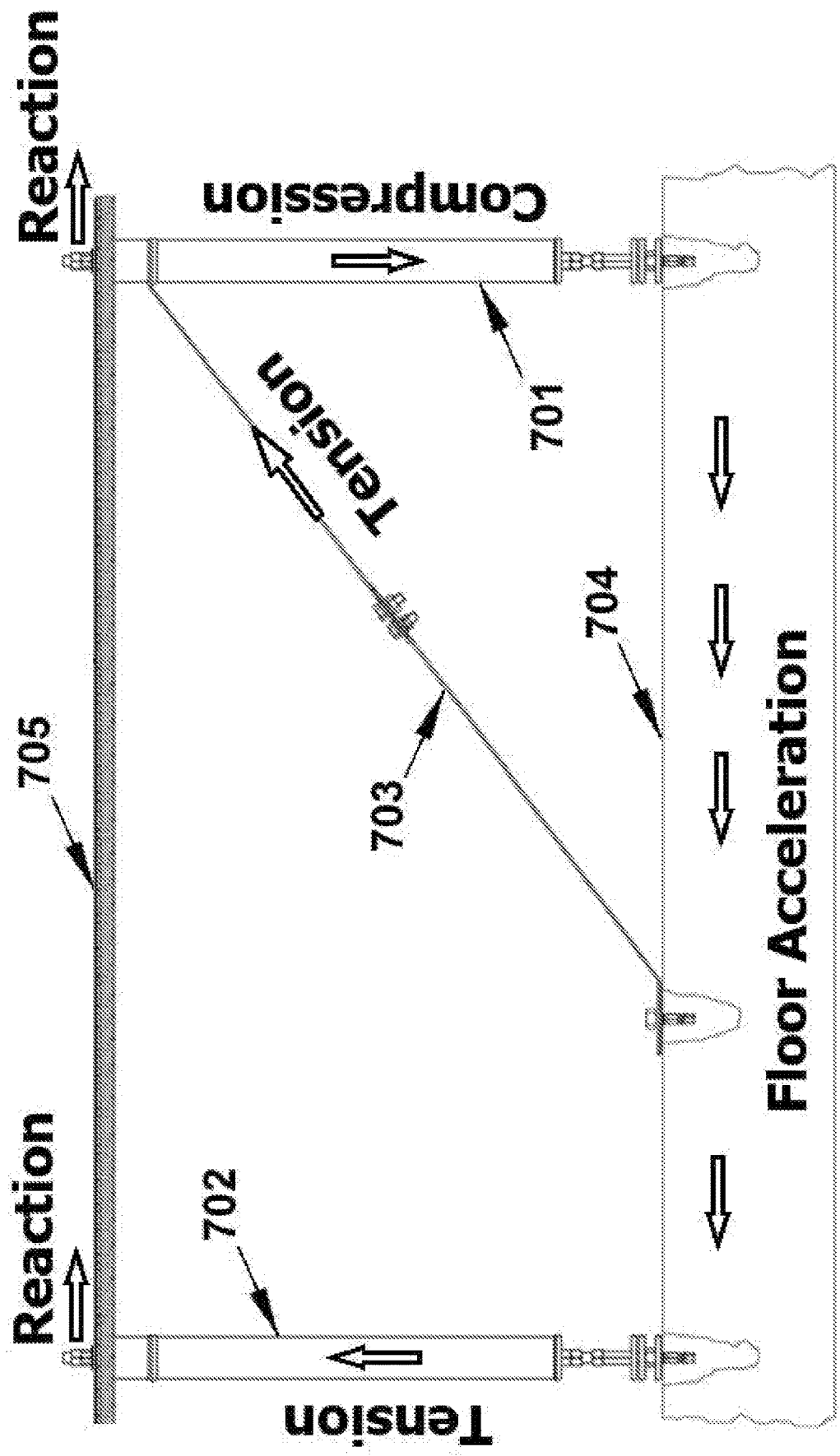
FIG. 7C is a schematic illustration of a side-view of another support system, in accordance with some demonstrative embodiments of the present invention.

Reference is also made to FIG. 7C, which is a schematic illustration of a side-view of a support system 720, in accordance with some demonstrative embodiments of the present invention. System 720 may correspond to, or may be an implementation of, for example, system 294 of FIG. 2D.

System 720 comprises a first vertical support member 701 and a second vertical support member 702, each one of them affixed to a low-tier 704 and to a top-tier 705 of a raised-floor system; and system 720 further comprises a slanted support member 703.

The Applicants have realized that it may be beneficial, efficient, and/or advantageous to construct the slanted support member as a non-monolithic structure which is comprised of two discrete and/or separable bars that may be modularly inter-connected or affixed to each other using a suitable connection mechanism (e.g., holes with nuts and bolts).

As demonstrated, for example, an earthquake or other natural or human-related event, may cause Acceleration moment at the low-tier 704 as indicated by the generally-horizontal Acceleration arrow; which in turn causes a generally-horizontal Reaction of the top-tier 705 towards the opposite horizontal direction. These forces are absorbed or converted by the support system (700, 710, 720), for example, as a downward-oriented generally-vertical Compression of the vertical support member 701, and/or as an upward-oriented generally-vertical Tension of the vertical support member 702, and/or as a slanted Tension of the slanted support member 703. This mechanism of the present invention leaves relatively very small residual moments on the vertical support member, which are transferred completely or almost entirely to its external pipe.

Some embodiments of the present invention may comprise, for example, one or more of the following, or a combination or an assembly of some or more of the following: (1) Add-on adjustable reinforcement system for equipment on raised floor, based on tunable push-pull poles and tunable length diagonals. (2) Add-on adjustable reinforcement system for raised floor stiffening, based on tunable push-pull poles and tunable length diagonals. (3) Low-cost, low weight, tunable length push-pull poles, based on threaded rod within thin shell pipe, pressed via centering caps. (4) Low-cost, low weight, tunable length diagonal, based on flat bars with special holes pattern and slotted hole. (5) A method or a process or a system of manufacturing and/or providing and/or assembling and/or installing and/or adjusting and/or using and/or constructing and/or mounting the reinforcement system. (6) A kit or assembly, of one or more modules and/or elements and/or pipes and/or rods and/or surfaces and/or components described above. (7) A system for producing or manufacturing or installing any one or more, or all, of the components or elements described above.

In some embodiments of the present invention, a system comprises: a vertical support member to fixedly connect to a top-tier of a raised-floor and to a bottom-tier of said raised floor, wherein the vertical support member comprises an internal rod surrounded by an external pipe, wherein the internal rod is generally concentric to the external pipe, wherein the internal rod and the external pipe are connected via a top-side cap and a bottom-side cap.

In some embodiments, the external pipe is a hollow shell; wherein the internal rod is non-touching said hollow shell.

In some embodiments, the vertical support member, that is structured of the internal rod and the external pipe that are generally concentric to each other, is able to support both a tension force and a compression force without buckling, and is also able to withstand moments without bending.

In some embodiments, a diameter of the internal rod is not more than 75 percent of a diameter of the external pipe. In some embodiments, a diameter of the internal rod is not more than 50 percent of a diameter of the external pipe. In some embodiments, a diameter of the internal rod is not more than 30 percent of a diameter of the external pipe. In some embodiments, a diameter of the internal rod is not more than 10 percent of a diameter of the external pipe.

In some embodiments, the system comprises: a slanted support member that diagonally connects (I) a top-region of the first vertical support member, with (II) the bottom-tier of said raised-floor.

In some embodiments, the slanted support member has adjustable and non-fixed length, to absorb a tension force due to acceleration of the bottom tier of the raised-floor and due to reaction of the top tier of the raised-floor; wherein the slanted support member remains securely and firmly affixed to the bottom-tier due via clamping and not necessarily via friction force.

In some embodiments, the slanted support member has a modifiable length, and comprises: a first slanted bar having a first set of holes, a second slanted bar having a second set of holes, and at least two bolts and at least two respective nuts, to secure the first slanted bar to the second slanted bar, wherein the two bolts pass through two holes of the first set of holes, and wherein the two bolts also pass through two holes of the second set of holes.

In some embodiments, the slanted support member has a modifiable length, and comprises: a first slanted bar having a first set of holes, a second slanted bar having a second set of holes, at least two bolts and at least two respective nuts, to secure the first slanted bar to the second slanted bar, wherein the two bolts pass through two holes of the first set of holes, and wherein the two bolts also pass through two holes of the second set of holes; wherein each hole in the first set of holes, is located at a first distance (T) from an adjacent hole in the first set of holes; wherein each hole in the second set of holes, is located at said first distance (T) from an adjacent hole in the second set of holes; wherein at least one of: the first slanted bar, and the second slanted bar, also has a particular hole, that is located at an end-region of said first or second slanted bar, and has a size (T/2) (e.g., a diameter;

a radius; a longest dimension; a length; or the like) which is half of the first distance and which enables fine-tuning of a total length of the slanted support member.

In some embodiments, the slanted support member has a modifiable length, and comprises: a first slanted bar having a set of holes, a second slanted bar having a set of threads, at least two bolts, to secure the first slanted bar to the second slanted bar, wherein the two bolts pass through two holes of the set of holes of the first slanted bar, and wherein the two bolts are tightly secured to the set of threads of the second slanted bar; wherein each hole in the set of holes, is located at a first distance (T) from an adjacent hole in said set of holes; wherein each thread in the set of threads, is located at said first distance (T) from an adjacent thread in said set of threads; wherein at least one of: the first slanted bar, and the second slanted bar, also has a particular hole, that is located at an end-region of said first or second slanted bar, wherein said particular hole has a size (T/2) which is half of the first distance (T) and which enables fine-tuning of a total length of the slanted support member.

In some embodiments, the slanted support member has a modifiable length, and comprises: a first slanted bar having a set of holes; a second slanted bar that has a set of corresponding markings or a set of smaller holes; at least two screws, to secure the first slanted bar to the second slanted bar, wherein the two screws pass through two holes of the set of holes and further pass via drilling through two drilled holes located in said second slanted bar at two of said markings or at two of said smaller holes; wherein each hole in the set of holes of the first slanted bar, is located at a first distance (T) from an adjacent hole in the set of holes of the first slanted bar; wherein each marking or each smaller hole in the second slanted bar, is located at said first distance (T) from an adjacent hole or marking in said second slanted bar; wherein at least one of: the first slanted bar, and the second slanted bar, also has a particular hole, that is located at an end-region of said first or second slanted bar, wherein said particular hole has a size (T/2) which is half of the first distance and which enables fine-tuning of a total length of the slanted support member.

In some embodiments, the slanted support member has a modifiable length, and comprises: a first slanted bar having a first set of holes, a second slanted bar having a second set of holes, at least two pins with securing elements, to fixedly secure the first slanted bar to the second slanted bar; wherein the securing elements are selected from the group consisting of: a bolt, a nut, a pin through a radial hole, circlip (or cir-clip, or circle-clip) in a groove, a shoulder, a wire through a hole or a groove, a bent edge, a bent end, a squeezed edge, a squeezed end, a male-female connection mechanism, a threaded mechanism; wherein the two pins pass through two holes of the first set of holes, and wherein the two bolts also pass through two holes of the second set of holes; wherein each hole in the first set of holes of the first slanted bar, is located at a first distance (T) from an adjacent hole in the first set of holes of said first slanted bar; wherein each hole in the second set of holes of the second slanted bar, is located at said first distance (T) from an adjacent hole in the second set of holes of said second slanted bar; wherein at least one of: the first slanted bar, and the second slanted bar, also has a particular hole, that is located at an end-region of said first or second slanted bar, wherein said particular hole has a size (T/2) which is half of the first distance (T) and which enables fine-tuning of a total length of the slanted support member.

In some embodiments, the slanted support member has a modifiable length, and comprises: a first slanted bar having a male connection-member, a second slanted bar having a female connection-member, wherein the male connection-member and the female connection-member form together a male-female connection mechanism able to fixedly and firmly hold together the first slanted bar and the second slanted bar.

In some embodiments, the first slanted bar is a monolithic metal element which comprises a first region and a second region, wherein the first slanted bar has a total length L1, wherein the first region spans at least 75 percent of the total length L1 of said first slanted bar, wherein the second region spans at most 25 percent of the total length L1 of said first slanted bar, wherein the first region and the second region are fixedly and monolithically connected to each other at an angle in the range of 110 to 160 degrees; wherein the second slanted bar is a monolithic metal element which comprises a third region and a fourth region, wherein the second slanted bar has a total length L2, wherein the third region spans at least 75 percent of the total length L2 of said second slanted bar, wherein the fourth region spans at most 25 percent of the total length L2 of said second slanted bar, wherein the third region and the fourth region are fixedly and monolithically connected to each other at an angle in the range of 110 to 160 degrees.

In some embodiments, the system further comprises: a slanted support member that diagonally connects (I) a top-region of the first vertical support member, with (II) a bottom-region of another, adjacent, vertical support member. The slanted support member has adjustable and non-fixed length, to absorb a tension force due to acceleration of the bottom tier of the raised-floor; wherein the slanted support member remains securely and firmly affixed to the bottom-tier due via clamping and not necessarily via friction force.

In some embodiments, the slanted support member has a modifiable length, and comprises: a first slanted bar having a first set of holes; a second slanted bar having a second set of holes; at least two bolts and at least two respective nuts; to secure the first slanted bar to the second slanted bar, wherein the two bolts pass through two holes of the first set of holes, and wherein the two bolts also pass through two holes of the second set of holes.

In some embodiments, the slanted support member has a modifiable length, and comprises: a first slanted bar having a male connection-member, a second slanted bar having a female connection-member, wherein the male connection-member and the female connection-member form together a male-female connection mechanism able to fixedly and firmly hold together the first slanted bar and the second slanted bar.

In some embodiments, the slanted support member has a modifiable length, and comprises: a first slanted bar having a set of holes, a second slanted bar that has corresponding markings, at least two screws and at least two respective nuts, to secure the first slanted bar to the second slanted bar, wherein the two screws pass through two holes of the first set of holes and further pass via drilling through two drilled holes located in two of said markings, wherein the two nuts secure the two respective screws.

In some embodiments, the slanted support member has a modifiable length, and comprises: a first slanted bar having a first set of holes, a second slanted bar having a second set of holes, at least two bolts and at least two respective nuts, to secure the first slanted bar to the second slanted bar, wherein the two bolts pass through two holes of the first set of holes, and wherein the two bolts also pass through two holes of the second set of holes; wherein each hole in the first set of holes, is located at a first distance (T) from an adjacent hole in the first set of holes; wherein each hole in the second set of holes, is located at said first distance (T) from an adjacent hole in the second set of holes; wherein at least one of: the first slanted bar, and the second slanted bar, also has a particular hole, that is located at an end-region of said first or second slanted bar, and has a size (T/2) which is half of the first distance and which enables fine-tuning of a total length of the slanted support member.

In some embodiments, the first slanted bar is a monolithic metal element which comprises a first region and a second region, wherein the first slanted bar has a total length L1, wherein the first region spans at least 80 percent of the total length L1 of said first slanted bar, wherein the second region spans at most 20 percent of the total length L1 of said first slanted bar, wherein the first region and the second region are fixedly and monolithically connected to each other at an angle in the range of 120 to 150 degrees; wherein the second slanted bar is a monolithic metal element which comprises a third region and a fourth region, wherein the second slanted bar has a total length L2, wherein the third region spans at least 80 percent of the total length L2 of said second slanted bar, wherein the fourth region spans at most 20 percent of the total length L2 of said second slanted bar, wherein the third region and the fourth region are fixedly and monolithically connected to each other at an angle in the range of 120 to 150 degrees.

In some embodiments, said vertical support member is a first vertical support member; wherein the system further comprises: a second vertical support member that is generally identical to the first vertical support member, a third vertical support member that is generally identical to the first vertical support member, a fourth vertical support member that is generally identical to the first vertical support member; a first slanted support member that diagonally connects: (A1) a top-region of the first vertical support member, with (A2) a bottom-region of the second vertical support member; a second slanted support member that diagonally connects: (B1) a top-region of the second vertical support member, with (B2) a bottom-region of the third vertical support member; a third slanted support member that diagonally connects: (C1) a top-region of the third vertical support member, with (C2) a bottom-region of the fourth vertical support member; a fourth slanted support member that diagonally connects: (D1) a top-region of the fourth vertical support member, with (D2) a bottom-region of the first vertical support member.

In some embodiments, each one of the first slanted support member, the second slanted support member, the third slanted support member, and the fourth slanted support member, has adjustable and non-fixed length, to absorb a tension force due to acceleration of the bottom tier of the raised-floor; wherein the slanted support member remains securely and firmly affixed to the bottom-tier due via clamping and not necessarily via friction force.

In some embodiments, each one of the first slanted support member, the second slanted support member, the third slanted support member, and the fourth slanted support member, has a modifiable length, and comprises: a first slanted bar having a first set of holes, a second slanted bar having a second set of holes, at least two bolts and at least two respective nuts, to secure the first slanted bar to the second slanted bar, wherein the two bolts pass through two holes of the first set of holes, and wherein the two bolts also pass through two holes of the second set of holes.

In some embodiments, the slanted support member has a modifiable length, and comprises: a first slanted bar having a male connection-member, a second slanted bar having a female connection-member, wherein the male connection-member and the female connection-member form together a male-female connection mechanism able to fixedly and firmly hold together the first slanted bar and the second slanted bar.

In some embodiments, wherein the slanted support member has a modifiable length, and comprises: a first slanted bar having a set of holes, a second slanted bar that has corresponding markings, at least two screws and at least two respective nuts, to secure the first slanted bar to the second slanted bar, wherein the two screws pass through two holes of the first set of holes and further pass via drilling through two drilled holes located in two of said markings, wherein the two nuts secure the two respective screws.

In some embodiments, the slanted support member has a modifiable length, and comprises: a first slanted bar having a first set of holes, a second slanted bar having a second set of holes, at least two bolts and at least two respective nuts, to secure the first slanted bar to the second slanted bar; wherein the two bolts pass through two holes of the first set of holes, and wherein the two bolts also pass through two holes of the second set of holes; wherein each hole in the first set of holes, is located at a first distance (T) from an adjacent hole in the first set of holes; wherein each hole in the second set of holes, is located at said first distance (T) from an adjacent hole in the second set of holes; wherein at least one of: the first slanted bar, and the second slanted bar, also has a particular hole, that is located at an end-region of said first or second slanted bar, and has a size (T/2) which is half of the first distance and which enables fine-tuning of a total length of the slanted support member.

In some embodiments, the internal rod has a circular cross-section; and the external pipe has a circular cross section.

In some embodiments, the internal rod has a first cross-section having a first shape; wherein the external pipe has a second, greater, cross section having a second, different, shape.

In some embodiments, the external pipe is formed of a first material having a first level of rigidity; wherein the internal rod is formed of a second, different, material having a second, different, level of rigidity.

In some embodiments, the external pipe is formed of a first material having a first level of rigidity; wherein the internal rod is formed of a second, different, material having a second, different, level of rigidity which is at least 1.5 times (or, at least 2.0 times; or at least 2.5 times; or at least 3 times; or at least 4 times; or at least 5 times) the first level of rigidity.

Functions, operations, components and/or features described herein with reference to one or more embodiments of the present invention, may be combined with, or may be utilized in combination with, one or more other functions, operations, components and/or features described herein with reference to one or more other embodiments of the present invention. The present invention may thus comprise any possible or suitable combinations, re-arrangements, assembly, re-assembly, or other utilization of some or all of the modules or functions or components that are described herein, even if they are discussed in different locations or different chapters of the above discussion, or even if they are shown across different drawings or multiple drawings.

While certain features of some demonstrative embodiments of the present invention have been illustrated and described herein, various modifications, substitutions, changes, and equivalents may occur to those skilled in the art. Accordingly, the claims are intended to cover all such modifications, substitutions, changes, and equivalents.

What is claimed is:

1. A system comprising:
a vertical support member to fixedly connect to a top-tier of a raised-floor and to a bottom-tier of said raised floor,
wherein the vertical support member comprises an internal rod surrounded by an external pipe,
wherein the internal rod is generally concentric to the external pipe,
wherein the internal rod and the external pipe are connected via a top-side cap and a bottom-side cap; and
a slanted support member that diagonally connects (I) a top-region of the first vertical support member, with (II) a bottom-region of another, adjacent, vertical support member;
wherein the slanted support member has a modifiable length, and comprises:
a first slanted bar having a set of holes,
a second slanted bar that has corresponding markings,
at least two screws and at least two respective nuts, to secure the first slanted bar to the second slanted bar, wherein the two screws pass through two holes of the first set of holes and further pass via drilling through two drilled holes located in two of said markings, wherein the two nuts secure the two respective screws.

2. A system comprising:
a vertical support member to fixedly connect to a top-tier of a raised-floor and to a bottom-tier of said raised floor,
wherein the vertical support member comprises an internal rod surrounded by an external pipe,
wherein the internal rod is generally concentric to the external pipe,
wherein the internal rod and the external pipe are connected via a top-side cap and a bottom-side cap;
wherein said vertical support member is a first vertical support member;
wherein the system further comprises:
a second vertical support member that is generally identical to the first vertical support member,
a third vertical support member that is generally identical to the first vertical support member,
a fourth vertical support member that is generally identical to the first vertical support member,
a first slanted support member that diagonally connects: (A1) a top-region of the first vertical support member, with (A2) a bottom-region of the second vertical support member,
a second slanted support member that diagonally connects: (B1) a top-region of the second vertical support member, with (B2) a bottom-region of the third vertical support member,
a third slanted support member that diagonally connects: (C1) a top-region of the third vertical support member, with (C2) a bottom-region of the fourth vertical support member,
a fourth slanted support member that diagonally connects: (D1) a top-region of the fourth vertical support member, with (D2) a bottom-region of the first vertical support member.

3. The system of claim 2,
wherein each one of the first slanted support member, the second slanted support member, the third slanted support member, and the fourth slanted support member, has a modifiable length, and comprises:
a first slanted bar having a first set of holes,
a second slanted bar having a second set of holes,
at least two bolts and at least two respective nuts, to secure the first slanted bar to the second slanted bar, wherein the two bolts pass through two holes of the first set of holes, and wherein the two bolts also pass through two holes of the second set of holes.

4. The system of claim 2,
wherein each one of the first slanted support member, the second slanted support member, the third slanted support member, and the fourth slanted support member, has a modifiable length, and comprises:
a first slanted bar having a male connection-member,
a second slanted bar having a female connection-member,
wherein the male connection-member and the female connection-member form together a male-female connection mechanism able to fixedly and firmly hold together the first slanted bar and the second slanted bar.

5. The system of claim 2,
wherein each one of the first slanted support member, the second slanted support member, the third slanted support member, and the fourth slanted support member, has a modifiable length, and comprises:
a first slanted bar having a set of holes,
a second slanted bar that has corresponding markings,
at least two screws and at least two respective nuts, to secure the first slanted bar to the second slanted bar, wherein the two screws pass through two holes of the first set of holes and further pass via drilling through two drilled holes located in two of said markings, wherein the two nuts secure the two respective screws.

6. The system of claim 2,
wherein each one of the first slanted support member, the second slanted support member, the third slanted support member, and the fourth slanted support member, has a modifiable length, and comprises:
a first slanted bar having a first set of holes,
a second slanted bar having a second set of holes,
at least two bolts and at least two respective nuts, to secure the first slanted bar to the second slanted bar,
wherein the two bolts pass through two holes of the first set of holes, and wherein the two bolts also pass through two holes of the second set of holes;
wherein each hole in the first set of holes, is located at a first distance (T) from an adjacent hole in the first set of holes;
wherein each hole in the second set of holes, is located at said first distance (T) from an adjacent hole in the second set of holes;
wherein at least one of: the first slanted bar, and the second slanted bar, also has a particular hole, that is located at an end-region of said first or second slanted bar, and has a size (T/2) which is half of the first distance and which enables fine-tuning of a total length of the slanted support member.

* * * * *